United States Patent
Jung et al.

(10) Patent No.: US 12,260,994 B2
(45) Date of Patent: Mar. 25, 2025

(54) COMPOSITE ELECTRONIC COMPONENT WITH ELECTRODE USING EPOXY

(71) Applicant: SAMSUNG ELECTRO-MECHANICS CO., LTD., Suwon-si (KR)

(72) Inventors: Kyung Moon Jung, Suwon-si (KR); Seong Hwan Park, Suwon-si (KR); Sung Jun Lim, Suwon-si (KR)

(73) Assignee: SAMSUNG ELECTRO-MECHANICS CO., LTD., Suwon-si (KR)

( * ) Notice: Subject to any disclaimer, the term of this patent is extended or adjusted under 35 U.S.C. 154(b) by 169 days.

(21) Appl. No.: 17/718,723

(22) Filed: Apr. 12, 2022

(65) Prior Publication Data

US 2023/0141373 A1    May 11, 2023

(30) Foreign Application Priority Data

Nov. 11, 2021  (KR) .................. 10-2021-0154817

(51) Int. Cl.
*H01G 4/30* (2006.01)
*H01G 4/008* (2006.01)
(Continued)

(52) U.S. Cl.
CPC ............. *H01G 4/30* (2013.01); *H01G 4/008* (2013.01); *H01G 4/012* (2013.01); *H01G 4/12* (2013.01); *H01G 4/2325* (2013.01)

(58) Field of Classification Search
None
See application file for complete search history.

(56) References Cited

U.S. PATENT DOCUMENTS

| | | | |
|---|---|---|---|
| 4,458,294 A * | 7/1984 | Womack .............. | H05K 3/3442 361/321.3 |
| 4,740,414 A * | 4/1988 | Shaheen ................ | H05K 1/113 428/428 |

(Continued)

FOREIGN PATENT DOCUMENTS

| | | | | |
|---|---|---|---|---|
| CN | 108695067 A | * | 10/2018 | ............. H01G 4/008 |
| CN | 112447396 A | * | 3/2021 | ............... H01G 2/02 |

(Continued)

OTHER PUBLICATIONS https://materials.springer.com/lb/docs/sm_lbs_978-3-540-31349-6_14 [Reference] (Year: 2024).*

(Continued)

*Primary Examiner* — Binh B Tran
*Assistant Examiner* — Muhammed Azam
(74) *Attorney, Agent, or Firm* — MORGAN, LEWIS & BOCKIUS LLP (57) ABSTRACT

A composite electronic component includes a ceramic electronic component including a body, comprising a dielectric layer and an internal electrode, and an external electrode disposed on the body and connected to the internal electrode; and an interposer including a substrate, disposed below the body, and a connection electrode disposed on the substrate and connected to the external electrode by a connection member. The external electrode includes a first electrode layer including metal particles and an insulating resin.

19 Claims, 5 Drawing Sheets

(51) Int. Cl.
   *H01G 4/012* (2006.01)
   *H01G 4/12* (2006.01)
   *H01G 4/232* (2006.01)

(56) References Cited

U.S. PATENT DOCUMENTS

| | | | | |
|---|---|---|---|---|
| 5,128,749 | A * | 7/1992 | Hornback | H05K 3/4629 |
| | | | | 257/702 |
| 5,358,775 | A * | 10/1994 | Horn, III | H05K 1/0373 |
| | | | | 428/209 |
| 5,495,395 | A * | 2/1996 | Yoneda | H05K 3/3426 |
| | | | | 174/265 |
| 5,811,883 | A * | 9/1998 | Ichikawa | H05K 3/3452 |
| | | | | 361/767 |
| 6,208,501 | B1 * | 3/2001 | Ingalls | H01G 4/06 |
| | | | | 361/308.1 |
| 6,317,331 | B1 * | 11/2001 | Kamath | H01L 23/3735 |
| | | | | 174/250 |
| 6,394,819 | B1 * | 5/2002 | Mosser, III | H05K 7/1061 |
| | | | | 439/83 |
| 7,000,316 | B2 * | 2/2006 | Schulz-Harder | H05K 3/4084 |
| | | | | 29/882 |
| 7,414,857 | B2 * | 8/2008 | Ritter | H01C 1/148 |
| | | | | 257/532 |
| 9,214,278 | B2 * | 12/2015 | Park | H01G 4/12 |
| 9,318,264 | B2 * | 4/2016 | Chung | H01G 4/30 |
| 9,520,234 | B2 * | 12/2016 | Kang | H01G 4/30 |
| 9,859,058 | B2 * | 1/2018 | Hong | H01G 4/30 |
| 9,881,736 | B2 * | 1/2018 | Park | H01G 4/38 |
| 9,966,191 | B2 * | 5/2018 | Noda | C03C 3/089 |
| 10,014,112 | B2 * | 7/2018 | Azuma | H01G 4/232 |
| 10,124,164 | B2 * | 11/2018 | Stevenson | A61N 1/375 |
| 10,128,048 | B2 * | 11/2018 | Park | H05K 1/181 |
| 10,283,271 | B2 * | 5/2019 | Nishimura | H05K 1/181 |
| 10,366,839 | B1 * | 7/2019 | Kim | H01G 4/248 |
| 10,395,842 | B2 * | 8/2019 | Lee | H01G 4/012 |
| 10,714,259 | B2 * | 7/2020 | Vaughan | H01G 2/065 |
| 11,043,333 | B2 * | 6/2021 | Son | H01G 4/40 |
| 11,094,460 | B2 * | 8/2021 | Yang | H01G 4/012 |
| 11,361,905 | B2 * | 6/2022 | Jeong | H01G 4/1227 |
| 11,437,193 | B2 * | 9/2022 | Kim | H01G 2/06 |
| 11,574,773 | B2 * | 2/2023 | Yi | H01G 4/248 |
| 11,587,735 | B2 * | 2/2023 | Park | H01G 4/008 |
| 12,020,869 | B2 * | 6/2024 | Kim | H01G 4/1218 |
| 12,148,571 | B2 * | 11/2024 | Choi | H01G 4/30 |
| 2007/0242416 | A1 * | 10/2007 | Saito | H01G 4/2325 |
| | | | | 361/321.1 |
| 2012/0024586 | A1 * | 2/2012 | Yoshimura | H05K 1/036 |
| | | | | 29/852 |
| 2012/0069487 | A1 * | 3/2012 | Noguchi | H01G 4/002 |
| | | | | 427/79 |
| 2012/0134066 | A1 * | 5/2012 | Kim | H01G 4/30 |
| | | | | 361/303 |
| 2013/0294006 | A1 * | 11/2013 | Kang | H01B 1/22 |
| | | | | 977/734 |
| 2014/0063683 | A1 * | 3/2014 | Gu | H01G 4/2325 |
| | | | | 427/79 |
| 2014/0233147 | A1 * | 8/2014 | Hong | H01G 4/008 |
| | | | | 361/301.4 |
| 2014/0284089 | A1 * | 9/2014 | Hattori | H01G 4/232 |
| | | | | 174/258 |
| 2015/0092316 | A1 * | 4/2015 | Chun | H01G 4/30 |
| | | | | 427/79 |
| 2015/0170786 | A1 * | 6/2015 | Hong | H01B 1/02 |
| | | | | 427/79 |
| 2015/0213953 | A1 * | 7/2015 | Jun | H01G 4/30 |
| | | | | 252/512 |
| 2015/0270065 | A1 * | 9/2015 | Hattori | H01G 4/232 |
| | | | | 174/255 |
| 2015/0279566 | A1 * | 10/2015 | Otani | H01G 4/008 |
| | | | | 361/301.4 |
| 2016/0099110 | A1 * | 4/2016 | Lee | C09D 5/24 |
| | | | | 252/514 |
| 2016/0309578 | A1 | 10/2016 | Park | |
| 2017/0148571 | A1 * | 5/2017 | Akada | H01G 4/232 |
| 2017/0178811 | A1 * | 6/2017 | Chun | H01G 4/2325 |
| 2017/0301468 | A1 * | 10/2017 | Kim | H01G 4/30 |
| 2018/0019063 | A1 * | 1/2018 | Ahn | H01G 4/33 |
| 2018/0137981 | A1 * | 5/2018 | Vaughan | H01G 4/232 |
| 2019/0013150 | A1 * | 1/2019 | Koo | H01G 4/2325 |
| 2019/0157006 | A1 * | 5/2019 | Han | H01G 4/008 |
| 2019/0198245 | A1 * | 6/2019 | Sanner | C04B 35/634 |
| 2020/0105474 | A1 | 4/2020 | Son et al. | |
| 2020/0118757 | A1 * | 4/2020 | Kageyama | H01G 4/1209 |
| 2020/0118764 | A1 * | 4/2020 | Kim | H01G 2/06 |
| 2020/0143991 | A1 * | 5/2020 | Sim | H01G 2/065 |
| 2020/0161051 | A1 * | 5/2020 | Tanaka | H01G 4/232 |
| 2021/0057160 | A1 * | 2/2021 | Kyeong | H01G 2/065 |
| 2021/0335547 | A1 * | 10/2021 | Yokomizo | H01G 4/232 |
| 2022/0208462 | A1 * | 6/2022 | Kim | H01G 4/30 |
| 2023/0141373 | A1 * | 5/2023 | Jung | H01G 4/12 |
| | | | | 361/306.3 |
| 2023/0215639 | A1 * | 7/2023 | Lee | H01G 4/30 |
| | | | | 361/301.4 |
| 2023/0386750 | A1 * | 11/2023 | Park | H01G 4/12 |

FOREIGN PATENT DOCUMENTS

| | | | | |
|---|---|---|---|---|
| CN | 118116738 A | * | 5/2024 | H01G 4/008 |
| JP | 2015-185651 A | | 10/2015 | |
| KR | 10-2015-0086342 A | | 7/2015 | |
| KR | 10-2016-0124564 A | | 10/2016 | |
| KR | 10-2019-0116157 A | | 10/2019 | |
| KR | 10-2019-0121184 A | | 10/2019 | |
| KR | 10-2021-0131858 A | | 11/2021 | |
| WO | WO-2012132952 A1 | * | 10/2012 | H01G 2/06 |

OTHER PUBLICATIONS https://dielectricmfg.com/resources/knowledge-base/glass-epoxy/ [Reference] (Year: 2024).*
https://www.engineeringtoolbox.com/linear-expansion-coefficients-d_95.html [Reference] (Year: 2024).*
Experimental Investigation of Thermal and Physical Properties [Reference] (Year: 2012).*
https://global.kyocera.com/prdct/fc/list/tokusei/bouchou/index.html [Reference] (Year: 2024).*
Yi. Elsevier. 2004. "Heat capacity, thermal conductivity, and thermal expansion of barium titanate-based ceramics" (Year: 2004).*
CN112530703. Jin. Mar. 19, 2021 (Year: 2021).*
Office Action issued in corresponding Korean Patent Application No. 10-2021-0154817 dated Apr. 12, 2024, with English translation.
Office Action issued in corresponding Korean Patent Application No. 10-2021-0154817 dated Dec. 16, 2024, with English translation.
Korean Office Action dated Dec. 16, 2024 issued in Korean Patent Application No. 10-2021-0154817 (with English translation).

* cited by examiner

COMPOSITE ELECTRONIC COMPONENT WITH ELECTRODE USING EPOXY

CROSS-REFERENCE TO RELATED APPLICATION(S)

The present application claims the benefit of priority to Korean Patent Application No. 10-2021-0154817, filed on Nov. 11, 2021 in the Korean Intellectual Property Office, the entire disclosure of which is incorporated herein by reference.

TECHNICAL FIELD

The present disclosure relates to a composite component, for example, a composite electronic component in which a ceramic electronic component and an interposer are vertically coupled to each other.

BACKGROUND

With the recent trend for higher capacitance of electronic devices such as smartphones, chargers, and laptop computers, more multilayer ceramic capacitors (MLCCs) are being applied. However, acoustic noise generated by the MLCC may cause discomfort to users. Therefore, MLCCs for suppressing generation of acoustic noise are being actively developed.

For example, research into a composite electronic component, in which an interposer is coupled to a lower portion of an MLCC, has been conducted. In a composite electronic component, an interposer attached to a lower portion of an MLCC may reduce transmission of vibrations of the MLCC, caused by a piezoelectric effect, to a main printed circuit board (PCB) during an operation of the MLCC to reduce acoustic noise.

However, such a composite electronic component may generate a difference in coefficients of thermal expansion (CTE) between an MLCC and an interposer, which may increase thermal stress inside the MLCC during a reflow process. Cracking may occur in the MLCC due to such thermal stress, resulting in poor reliability such as a burnt defect.

SUMMARY

An aspect of the present disclosure is to provide a composite electronic component which may reduce thermal stress generated inside a ceramic electronic component.

Exemplary embodiments in the present disclosure provide various solutions, and one of the solutions is to introduce an electrode layer having a relatively low modulus into an external electrode of a ceramic electronic component.

According to an aspect of the present disclosure, a composite electronic component includes a ceramic electronic component including a body, comprising a dielectric layer and an internal electrode, and an external electrode disposed on the body and connected to the internal electrode; and an interposer including a substrate, disposed below the body, and a connection electrode disposed on the substrate and connected to the external electrode by a connection member. The external electrode includes a first electrode layer including metal particles and an insulating resin.

According to an aspect of the present disclosure, a composite electronic component includes: a ceramic electronic component including a body, comprising a dielectric layer and an internal electrode, and an external electrode disposed on the body and connected to the internal electrode; and an interposer including a substrate, disposed below the body, and a connection electrode disposed on the substrate and connected to the external electrode by a connection member. The external electrode includes a first electrode layer, disposed on the body, and a second electrode layer disposed on the first electrode layer. The first electrode layer has a modulus lower than a modulus of the second electrode layer.

BRIEF DESCRIPTION OF DRAWINGS

The above and other aspects, features, and advantages of the present disclosure will be more clearly understood from the following detailed description, taken in conjunction with the accompanying drawings.

DETAILED DESCRIPTION

Hereinafter, exemplary embodiments in the present disclosure will be described with reference to the accompanying drawings. In the accompanying drawings, shapes, sizes, and the like, of components may be exaggerated or shortened for clarity.

Figure 1:
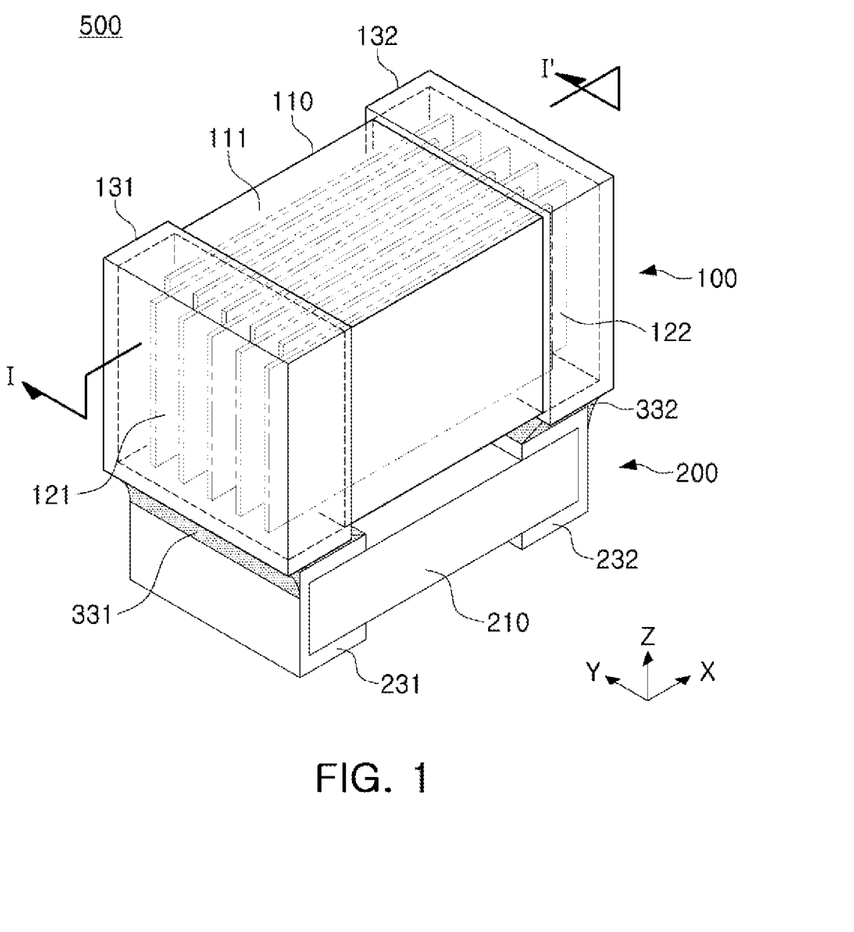
FIG. 1 is a schematic perspective view of a composite electronic component according to an exemplary embodiment in the present disclosure.

FIG. 1 is a schematic perspective view of a composite electronic component according to an exemplary embodiment in the present disclosure.

Referring to FIG. 1, a composite electronic component 500 according to an exemplary embodiment may include a ceramic electronic component 100 and an interposer 200. The ceramic electronic component 100 and the interposer 200 may be vertically laminated to be coupled to each other. The ceramic electronic component 100 and the interposer 200 may be coupled to each other through connection members 331 and 332 including a solder, a conductive adhesive, and the like. For example, external electrodes 131 and 132 to be described later of the ceramic electronic component 100 and connection electrodes 231 and 232 to be described later of the interposer 200 may be connected to each other using a solder, a conductive adhesive, or the like. As a non-limiting example, after applying a solder to the connection electrodes 231 and 232 of the interposer 200, the ceramic electronic component 100 may be laminated on the interposer 200 to connect the external electrodes 131 and 132 to the connection electrodes 231 and 232. When a temperature is increased to a high temperature, at which a solder melts through a reflow process, and is then decreased, the solder may be hardened and bonding may be completed. In some embodiments, the connection member may cover an edge of the connection electrode. In some embodiments, the connection member may contact a first surface of the connection electrode facing the ceramic electronic component, and a second surface of the connection electrode adjacent to the first surface of the connection electrode.

The ceramic electronic component 100 may include a body 110, including a dielectric layer 111 and internal electrodes 121 and 122, and external electrode 131 and 132 disposed on the body 110 and connected to the internal electrodes 121 and 122. The body 110 may have a substantially hexahedral shape having a first surface (or a left surface) and a second surface (or a right surface) opposing each other in an X direction (or a length direction), a third surface (or a front surface) and a fourth surface (or a rear surface) opposing each other in a Y direction (or a width direction)), and a fifth surface (or an upper surface) and a sixth surface (a lower surface) opposing each other in a Z direction (or a thickness direction). As necessary, an angular exterior of the body 110, for example, a corner portion of the body 110, may be polished to be rounded by a polishing process, or the like. As necessary, the external electrodes 131 and 132 may have an angular shape, for example, a rounded shape, and may have a concave shape and/or a convex shape in some regions.

The dielectric layer 111 may be formed by sintering a ceramic green sheet including ceramic powder particles, an organic solvent, and an organic binder. The ceramic powder particles are a material having a high-k dielectric constant. As the ceramic powder particles, a barium titanate (BaTiO$_3$)-based material, a strontium titanate (SrTiO$_3$)-based material, or the like. As described above, the dielectric layer 111 may include a ferroelectric material, but exemplary embodiments are not limited thereto. The dielectric layer 111 may be in a state, in which a plurality of layers are laminated and sintered, and may be integrated with each other such that boundaries between adjacent layers are not readily apparent to the naked eye.

The internal electrodes 121 and 122 may be formed by a conductive paste including a conductive metal. For example, the internal electrodes 121 and 122 may be printed by printing a conductive paste on the ceramic green sheet, forming the dielectric layer 111, through a printing method such as a screen-printing method or a gravure printing method. When the ceramic green sheets, on which the internal electrodes 121 and 122 are printed, are alternately laminated and sintered, the body 110 may be formed. The conductive metal may include, but is not limited to, nickel (Ni), copper (Cu), palladium (Pd), silver (Ag), gold (Au), platinum (Pt), tin (Sn), tungsten (W), titanium (Ti), and/or alloys thereof.

The internal electrodes 121 and 122 may include a plurality of first internal electrodes 121 and a plurality of second internal electrodes 122. The plurality of first and second internal electrodes 121 and 122 may be disposed to be separated from each other with respective dielectric layers 111 interposed therebetween. The plurality of first and second internal electrodes 121 and 122 may be alternately laminated in the Y direction of the body 110 and may be exposed to the first and second surfaces of the body 110, respectively. As a result, the plurality of first and second internal electrodes 121 and 122 may be connected to first and second external electrodes 131 and 132 to be described later, respectively. However, this is only an example, and the plurality of first and second internal electrodes 121 and 122 may be arranged in other forms. For example, the plurality of first and second internal electrodes 121 and 122 may be alternately laminated in the Z direction of the body 110 to be respectively exposed to the first and second surfaces of the body 110, but exemplary embodiments are not limited thereto.

The external electrodes 131 and 132 may include a first external electrode 131 and a second external electrode 132. The first and second external electrodes 131 and 132 may be disposed on opposite end portions of the body 110 in the X direction, respectively. For example, the first external electrode 131 may be disposed on the first surface of the body 110 to extend partially upwardly of the third to sixth surfaces of the body 110, and the second external electrode 132 may be disposed on the second surface of the body 110 to extend partially upwardly of the third to sixth surfaces of the body 110. However, this is only an example, and the first and second external electrodes 131 and 132 may be disposed in other forms. For example, the first external electrode 131 may be disposed on the first surface of the body 110 to extend partially upwardly of the fifth and sixth surfaces of the body 110, and the second external electrode 132 may be disposed on the second surface of the body 110 to extend partially upwardly of the fifth and sixth surfaces of the body 110. However, example embodiments are not limited thereto, and this is also only another example.

The external electrodes 131 and 132 may include one or more electrode layers, as will be described later. The one or more electrode layers of the external electrodes 131 and 132 may include a first electrode layer, a second electrode layer, and/or a third electrode layer, which will be described later.

The interposer 200 includes a substrate 210 and connection electrodes 231 and 232 disposed on the substrate 210. The substrate 210 may have a substantially hexahedral shape having a first surface (or a left surface) and a second surface (or a right surface) opposing each other in the X direction (or the length direction), a third surface (or a front surface) and a fourth surface (a rear surface) opposing each other in the Y direction (or the width direction), and a fifth surface (or an upper surface) and a sixth surface (or a lower surface) opposing each other in the Z direction (or the thickness direction). As necessary, an angular exterior of the substrate 210, for example, a corner portion of the substrate 210, may be polished to be rounded. As necessary, an angular exterior of the connection electrodes 231 and 232, for example, a corner portion of the connection electrodes 231 and 232, may also have a rounded shape, and may have a concave shape and/or a convex shape in some regions.

The substrate 210 may include various types of material. For example, the substrate 210 may be an insulating substrate including various types of thermosetting resin and/or thermoplastic resins. Alternatively, the substrate 210 may be a ceramic substrate including alumina (Al$_2$O$_3$). When the substrate 210 is a ceramic substrate, transmission of vibration generated from the ceramic electronic component 100 may be more effectively blocked because a material of the ceramic substrate is relatively hard. As a result, acoustic noise may be more effectively reduced.

The connection electrodes 231 and 232 may include a first connection electrode 231 and a second connection electrode 232. The first and second connection electrodes 231 and 232 may be disposed in opposite end portions of the substrate 210 in the X direction, respectively. For example, the first connection electrode 231 may be disposed on the first surface of the substrate 210 to extend partially upwardly of the third surface to the sixth surface, and the second connection electrode 232 may be disposed on the second surface of the substrate 210 to partially extended upwardly of the third to sixth surfaces. However, this is only an example, and the first and second connection electrodes 231 and 232 may be disposed in another form. For example, the first connection electrode 231 may be disposed on the first surface of the substrate 210 to extend partially upwardly of the fifth and sixth surfaces, and the second connection electrode 232 may be disposed on the second surface of the substrate 210 to extend partially upwardly of the fifth and sixth surfaces. However, exemplary embodiments are not limited thereto, and this is also only another example.

The connection electrodes 231 and 232 may include one or more electrode layers, as will be described later. The one or more electrode layers of the connection electrodes 231 and 232 may include a conductive resin layer and/or a plating layer, which will be described in detail later.

The ceramic electronic component 100 may be relatively larger than the interposer 200. For example, the body 110 of the ceramic electronic component 100 may be higher in length, thickness, and width than the interposer 200. The lengths, thicknesses, and widths of the ceramic electronic component 100 and the interposer 200 may be determined by, for example, a scanning electron microscope. In this case, the ceramic electronic component 100 may have better space efficiency than in the case in which the composite electronic component 500 is mounted on the main substrate. However, this is only an example. As necessary, the substrate 210 of the interposer 200 may be higher in length and width than the body 110 of the ceramic electronic component 100.

Figure 2:
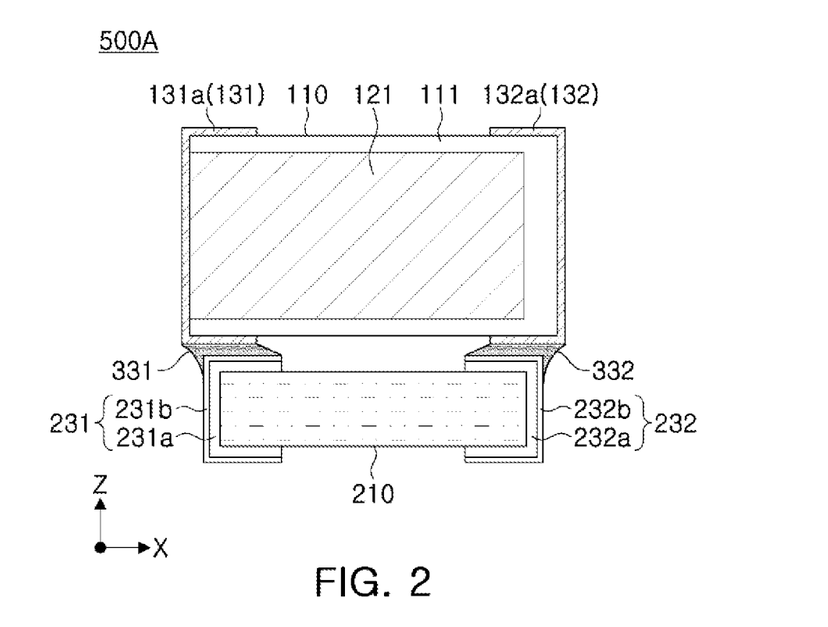
FIG. 2 is a schematic cross-sectional view, illustrating an example of the composite electronic component of FIG. 1, taken along line I-I' of FIG. 1.

FIG. 2 is a schematic cross-sectional view, illustrating an example of the composite electronic component of FIG. 1, taken along line I-I' of FIG. 1.

Referring to FIG. 2, a composite electronic component 500A according to an exemplary embodiment may include a ceramic electronic component 100 in which external electrodes 131 and 132 are disposed on a body 110, and first electrode layers 131a and 132a are connected to external electrodes 121 and 122. For example, the first external electrode 131 may include a 1-1-th electrode layer 131a as an electrode layer, and the second external electrode 132 may include a 1-2-th electrode layer 132a as an electrode layer. The 1-1-th electrode layer 131a may be connected to a plurality of first internal electrodes 121. The 1-2-th electrode layer 132a may be connected to a plurality of second internal electrodes 122.

The 1-1-th electrode layer 131a may be disposed on a first surface of the body 110 to extend partially upwardly of third to sixth surfaces of the body 110 or only fifth and sixth surfaces of the body 110, but exemplary embodiments are not limited thereto. The 1-2-th electrode layer 132a may be disposed on a second surface of the body 110 to extend partially upwardly of the third to sixth surfaces of the body 110, or only the fifth and sixth surfaces of the body 110, but exemplary embodiments are not limited thereto.

Each of the first electrode layers 131a and 132a may be directly disposed on at least one surface of the body 110. For example, the 1-1-th electrode layer 131a may be directly disposed on the first surface of the body 110, and a portion of the 1-1-th electrode layer 131a may be disposed to directly extend to the third to sixth surfaces of the body 110 or to directly extend to only the fifth and sixth surfaces. In addition, the 1-2-th electrode layer 132a may be directly disposed on the second surface of the body 110, and a portion of the 1-2-th electrode layer 132a may be disposed to directly extend to the third to sixth surfaces of the body 110 or to directly extend to only the surface and the sixth surface.

Figure 4:
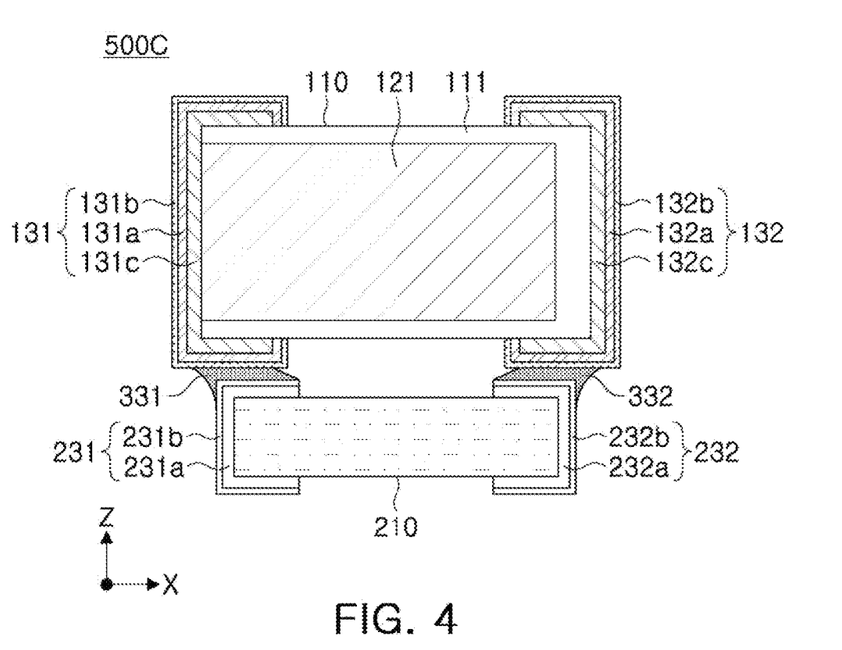
FIG. 4 is a schematic cross-sectional view, illustrating another example of the composite electronic component of FIG. 1, taken along line I-I' of FIG. 1.

Here, "a certain electrode layer is directly disposed on one surface of a body" may mean that another electrode layer is not present between the certain electrode layer and the one surface of the body. For example, even when end portions of the first electrode layers 131a and 132a are in direct contact with portions of the fifth and sixth surfaces of the body 110 as illustrated in FIG. 4 to be described later, third electrode layers 131c and 132c may be present between the first electrode layers 131a and 132a and the fifth and sixth surfaces of the body 110. In this case, the first electrode layers 131a and 132a may not be considered to be directly disposed on the fifth and sixth surfaces of the body 110.

The first electrode layers 131a and 132a may have a modulus lower than that of a conductive layer or a metal layer including copper (Cu), nickel (Ni), tin (Sn), or the like. For example, first electrode layers 131a and 132a may be relatively more flexible than the conductive layer or the metal layer. The term "flexible" may refer to a modulus relatively lower than that of a metal itself. For example, the first electrode layers 131a and 132a may have a modulus lower than that of a conductive layer or a metal layer such as a copper (Cu) layer, a nickel (Ni) layer, or a tin (Sn) layer. In this regard, the first electrode layers 131a and 132a may have a modulus of 10 GPa or less, for example, about 5 GPa to 7 GPa or about 3 GPa to 5 GPa. The modulus may be an elastic modulus. The elastic modulus may refer to a ratio of stress to strain, and may be measured through, for example, a standard tensile test specified in JIS C-6481, KS M 3001, KS M 527-3, ASTM D882, and the like, but example embodiments are not limited thereto.

The first electrode layers 131a and 132a may include metal particles and an insulating resin. The first electrode layers 131a and 132a may include such a mixture material to have a modulus lower than that of a layer including only a metal. The metal particles may include copper (Cu), aluminum (Al), silver (Ag), tin (Sn), gold (Au), nickel (Ni), lead (Pb), titanium (Ti), and/or alloys thereof, in detail, copper (Cu), silver (Ag), and/or alloys thereof, but exemplary embodiments are not limited thereto. The insulating resin may include a thermosetting resin such as epoxy and/or a thermoplastic resin such as polyimide, in detail, epoxy, but exemplary embodiments are not limited thereto. As a non-limiting example, the first electrode layers 131a and 132a may include a copper (Cu)-epoxy mixture material or a silver (Ag)-epoxy mixture material. The first electrode layers 131a and 132a may be formed by applying a mixture material, including metal particles and an insulating resin, and curing the applied mixture material, but exemplary embodiments are not limited thereto.

As in one example, when the external electrodes 131 and 132 of the ceramic electronic component 100 include the first electrode layers 131a and 132a, the interposer 200 may relatively expand during reflow temperature reduction as compared with the ceramic electronic component 100. In this case, a difference in coefficient of thermal expansion (CTE) between the ceramic electronic component 100 and the interposer 200 may be effectively eliminated as the first electrode layers 131a and 132a are stretched. Accordingly, the thermal stress generated inside the ceramic electronic component 100 may be more effectively reduced. This will be described in detail later.

Continuing to refer to FIG. 2, the composite electronic component 500A according to an exemplary embodiment may include conductive resin layers 231a and 232a, in which the connection electrodes 231 and 232 of the interposer 200 are disposed on a substrate 210, and plating layers 231b and 232b disposed on the conductive resin layers 231a and 232a. For example, the first connection electrode 231 may include a first conductive resin layer 231a and a first plating layer 231b, and the second connection electrode 232 may include a second conductive resin layer 232b and a second conductive resin layer 231b.

The first conductive resin layer 231a may be disposed on the first surface of the substrate 210 to extend partially upwardly of the third to sixth surfaces of the substrate 210, or to extend partially upwardly of the fifth and sixth surfaces of the substrate 210, and the first plating layer 231b may be disposed on the first conductive resin layer 231a to cover the first conductive resin layer 231a, but exemplary embodiments are not limited thereto. The second conductive resin layer 232a may be disposed on the second surface of the substrate 210 to extend partially upwardly of the third to sixth surfaces of the substrate 210 or to extend partially upwardly of the fifth and sixth surfaces of the substrate 210, and the second plating layer 232b may be disposed on the second conductive resin layer 232a to cover the second conductive resin layer 232a, but exemplary embodiments are not limited thereto.

The conductive resin layers 231a and 232a may protect the composite electronic component 500 from mechanical and/or thermal stress and warpage impact of the substrate, resulting from a process temperature when the composite electronic component 500 is mounted on a main substrate, or the like. The conductive resin layers 231a and 232a may include conductive particles and a dispersion resin. The conductive particles may include copper (Cu), aluminum (Al), silver (Ag), tin (Sn), gold (Au), nickel (Ni), lead (Pb), titanium (Ti), and/or alloys thereof, in detail, copper (Cu), nickel (Ni), and/or alloys thereof. However, exemplary embodiments are not limited thereto, and the conductive resin layers 231a and 232a may include conductive particles other than a metal such as carbon particles. The dispersion resin may include a thermosetting resin such as epoxy, acryl, melamine, phenol, polyimide, resol-type phenol, and unsaturated polyester, in detail, epoxy. However, exemplary embodiments are not limited thereto, and the dispersion resin may include a photocurable resin. The conductive resin layers 231a and 232b may be formed by applying a mixture material, including conductive particles and a dispersion resin, and curing the applied mixture material, but exemplary embodiments are not limited thereto.

The plating layers 231b and 232b may improve connection reliability of the connection electrodes 231 and 232. The plating layers 231b and 232b may include a nickel (Ni) plating layer, a tin (Sn) plating layer, or a combination thereof. For example, the first plating layer 231b may include a first nickel (Ni) plating layer, covering the first conductive resin layer 231a, and a first tin (Sn) plating layer covering the first nickel (Ni) plating layer. The second plating layer 232b may include a second nickel (Ni) plating layer, covering the second conductive resin layer 232a, and a second tin (Sn) plating layer covering the second nickel (Ni) plating layer. However, exemplary embodiments are not limited thereto, and other plating materials may be used. The plating layers 231b and 232b may be formed by a known plating process such as an electrolytic plating process, an electroless plating process, or the like, and a detailed plating method is not limited.

Figure 3:
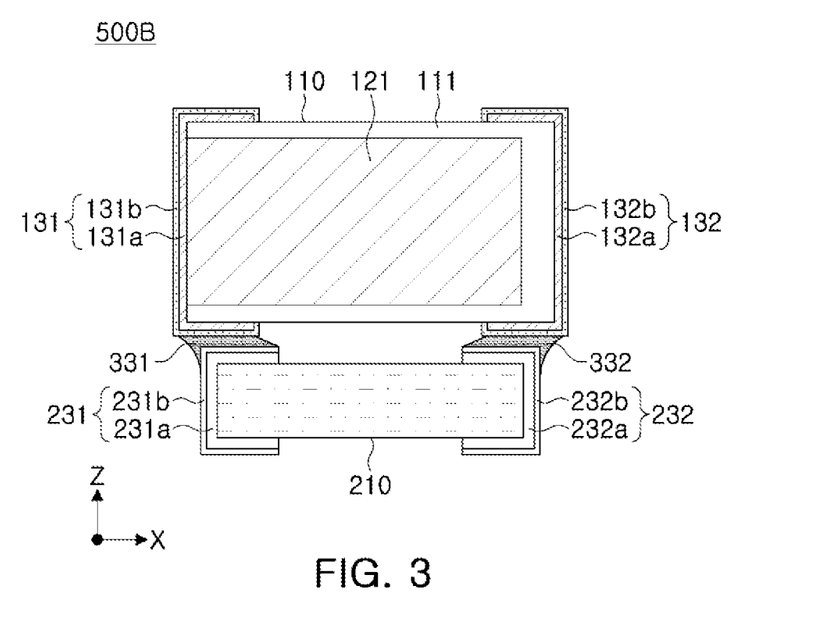
FIG. 3 is a schematic cross-sectional view, illustrating another example of the composite electronic component of FIG. 1, taken along line I-I' of FIG. 1.

FIG. 3 is a schematic cross-sectional view, illustrating another example of the composite electronic component of FIG. 1, taken along line I-I' of FIG. 1.

Referring to FIG. 3, a composite electronic component 500B according to another exemplary embodiment may include a ceramic electronic component 100 in which external electrodes 131 and 132 are disposed on a body 110, first electrodes 131a and 132a are connected to internal electrodes 121 and 122, and second electrodes 131b and 132b are disposed on the first electrode layer 131a and 132a. For example, the first external electrode 131 may include a 1-1-th electrode layer 131a and a 2-1-th electrode layer 131b as a plurality of electrode layers. The second external electrode 132 may include a 1-2-th electrode layer 132a and a 2-2-th electrode layer 132b as a plurality of electrode layers. The 1-1-th electrode layer 131a may be connected to the plurality of first internal electrodes 121. The 1-2-th electrode layer 132a may be connected to the plurality of second internal electrodes 122. The first electrode layers 131a and 132a may be thicker than the second electrode layers 131b and 132b, but exemplary embodiments are not limited thereto.

The 1-1-th electrode layer 131a may be disposed on a first surface of the body 110 to extend partially upwardly of third to sixth surfaces of the body 110 or to extend partially upwardly of only fifth and sixth surfaces of the body 110, and the 2-1-th electrode layer 131b may be disposed on the 1-1 electrode layer 131a to cover the 1-1 electrode layer 131a, but exemplary embodiments are not limited thereto. The 1-2-th electrode layer 132a may be disposed on the second surface of the body 110 to extend partially upwardly of the third to sixth surfaces of the body 110 or to extend partially upwardly of the fifth and sixth surfaces of the body 110, and the 2-2-th electrode layer 132b may be disposed on the 1-2-th electrode layer 132a to cover the 1-2-th electrode layer 132a, but exemplary embodiments are not limited thereto.

Each of the first electrode layers 131a and 132a may be directly disposed on at least one surface of the body 110. For example, the 1-1-th electrode layer 131a may be directly disposed on the first surface of the body 110, and a portion of the 1-1-th electrode layer 131a may be disposed to directly extend to the third to sixth surfaces of the body 110 or to directly extend to only the fifth and sixth surfaces. The 2-1-th electrode layer 131b may be directly disposed on the 1-1-th electrode layer 131a. In addition, the 1-2-th electrode layer 132a may be directly disposed on the second surface of the body 110, and a portion of the 1-2-th electrode layer 132a may be disposed to directly extend to the third to sixth surfaces of the body 110 or to directly extend to only the fifth and the sixth surfaces. The 2-2-th electrode layer 132b may be directly disposed on the 1-2-th electrode layer 132a.

Here, "one electrode layer is directly disposed on another electrode layer" may mean that an additional electrode layer is not present between the electrode layers.

The second electrode layers 131b and 132b may improve connection reliability of the external electrodes 131 and 132. The second electrode layers 131b and 132b may include a metal layer including nickel (Ni), a metal layer including tin (Sn), or a combination thereof. For example, the 2-1-th electrode layer 131b may include a first nickel (Ni) layer, covering the 1-1-th electrode layer 131a, and a first tin (Sn) layer covering the first nickel (Ni) layer. The 2-2-th electrode layer 132b may include a second nickel (Ni) layer, covering the 1-2 electrode layer 132a, and a second tin (Sn) layer covering the second nickel (Ni) layer. However, exemplary embodiments are not limited thereto, and the second electrode layers 131*b* and 132*b* may include another metal. The second electrode layers 131*b* and 132*b* may be formed by a known plating process such as an electrolytic plating process or an electroless plating process, and a detailed plating method is not limited.

The other contents are substantially the same as described in the above-described composite electronic component 500A according to an exemplary embodiment, and redundant descriptions will be omitted.

FIG. 4 is a schematic cross-sectional view, illustrating another example of the composite electronic component of FIG. 1, taken along line I-I' of FIG. 1.

Referring to FIG. 4, a composite electronic component 500C according to another exemplary embodiment may include a ceramic electronic component 100 in which external electrodes 131 and 132 are disposed on a body 110, third electrode layers 131*c* and 132*c* are connected to internal electrodes 121 and 122, first electrode layers 131*a* and 132*a* are disposed on the third electrode layers 131*c* and 132*c*, and second electrode layers 131*b* and 132*b* disposed on the first electrode layers 131*a* and 132*a*. For example, the first external electrode 131 may include a 3-1-th electrode layer 131*c*, a 1-1-th electrode layer 131*a*, and a 2-1-th electrode layer 131*b* as a plurality of electrode layers. The second external electrode 132 may include a 3-2-th electrode layer 132*c*, a 1-2-th electrode layer 132*a*, and a 2-2-th electrode layer 132*b* as a plurality of electrode layers. The 3-1-th electrode layer 131*c* may be connected to the plurality of first internal electrodes 121. The 3-2-th electrode layer 132*c* may be connected to the plurality of second internal electrodes 122. The third electrode layers 131*c* and 132*c* may be thicker than the first electrode layers 131*a* and 132*a*, and the first electrode layers 131*a* and 132*a* may be thicker than the second electrode layers 131*b* and 132*b*, but exemplary embodiments are not limited thereto.

The 3-1-th electrode layer 131*c* may be disposed on a first surface of the body 110 to extend partially upwardly of third to sixth surfaces of the body 110 or to extend partially upwardly of only fifth and sixth surfaces of the body 110, the 1-1-th electrode layer 131*a* may be disposed on the 3-1-th electrode layer 131*c* to cover the 3-1-th electrode layer 131*c*, and the 2-1-th electrode layer 131*b* may be disposed on the 1-1-th electrode layer 131*a* to cover the 1-1-th electrode layer 131*a*, but exemplary embodiments are not limited thereto. The 3-2-th electrode layer 132*c* may be disposed on the second surface of the body 110 to extend partially upwardly of the third to sixth surfaces of the body 110 or to extend upwardly of only the fifth and sixth surfaces of the body 110, the 1-2-th electrode layer 132*a* may be disposed on the 3-2-th electrode layer 132*c* to cover the 3-2-th electrode layer 132*c*, and the 2-2-th electrode layer 132*b* may be disposed on the 1-2-th electrode layer 132*a* to cover the 1-2-th electrode layer 132*a*, but exemplary embodiments are not limited thereto.

Each of the third electrode layers 131*c* and 132*c* may be directly disposed on at least one surface of the body 110. For example, the 3-1-th electrode layer 131*c* may be directly disposed on a first surface of the body 110, and a portion of the 3-1-th electrode layer 131*c* may be disposed to directly extend to third to sixth surfaces of the body 110 or to directly extend to only fifth and sixth surfaces of the body 100. The 1-1-th electrode layer 131*a* may be directly disposed on the 3-1-th electrode layer 131*c*. The 2-1-th electrode layer 131*b* may be directly disposed on the 1-1-th electrode layer 131*a*. In addition, the 3-2-th electrode layer 132*c* may be directly disposed on the second surface of the body 110, and a portion of the 3-2-th electrode layer 132*c* may be disposed to directly extend to the third to sixth surfaces of the body 110 or to directly extend to only the fifth and sixth surfaces of the body 110. The 1-2-th electrode layer 132*a* may be directly disposed on the 3-2-th electrode layer 132*c*. The 2-2-th electrode layer 132*b* may be directly disposed on the 1-2-th electrode layer 132*a*.

Improved connectivity between the internal electrodes 121 and 122 and the external electrodes 131 and 132 may be secured through the third electrode layers 131*c* and 132*c*. The third electrode layers 131*c* and 132*c* may include a conductive material. For example, each of the third electrode layers 131*c* and 132*c* may be a conductive layer including a conductive material. The conductive material may include copper (Cu), nickel (Ni), palladium (Pd), platinum (Pt), gold (Au), silver (Ag), lead (Pb), and/or alloys thereof. As necessary, the third electrode layers 131*c* and 132*c* may further include glass. The third electrode layers 131*c* and 132*c* may be formed by a method of dipping in a paste containing a conductive material or a method of printing a conductive paste containing a conductive material. However, exemplary embodiments are not limited thereto, and the third electrode layers 131*c* and 132*c* may be formed by a sheet transfer method, a pad transfer method, or the like.

The other contents are substantially the same as described in the above-described composite electronic component 500A according to an exemplary embodiment and the above-described composite electronic component 500B according to another exemplary embodiment, and redundant descriptions will be omitted.

Figure 5:
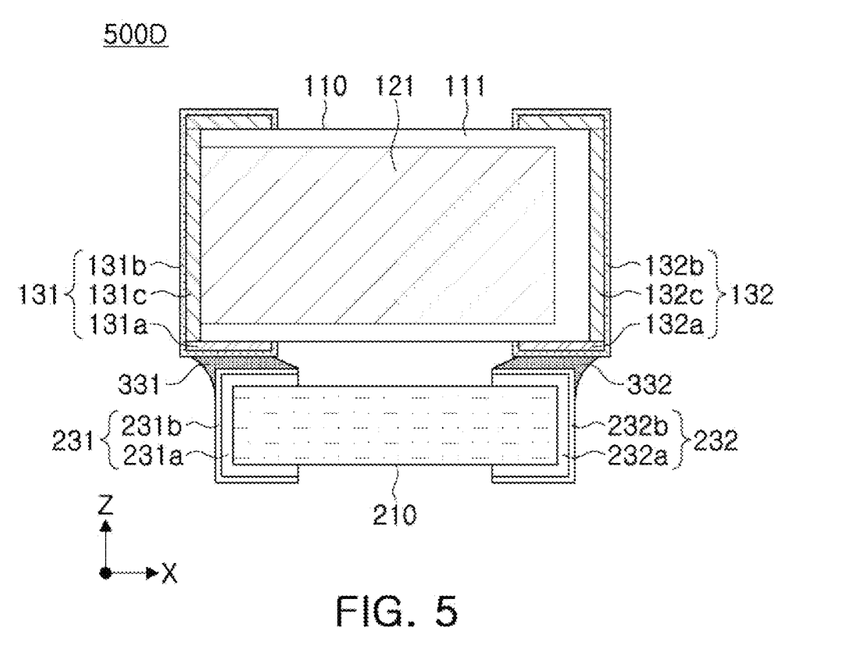
FIG. 5 is a schematic cross-sectional view, illustrating another example of the composite electronic component of FIG. 1, taken along line I-I' of FIG. 1.

FIG. 5 is a schematic cross-sectional view, illustrating another example of the composite electronic component of FIG. 1, taken along line I-I' of FIG. 1.

Referring to FIG. 5, a composite electronic component 500D according to another exemplary embodiment may include a ceramic electronic component 100 in which external electrodes 131 and 132 are disposed on a side surface and an upper surface of a body 110, third electrode layers 131*c* and 132*c* are connected to internal electrodes 121 and 122, first electrode layers 131*a* and 132*a* are disposed on a lower surface of the body 110, and second electrode layers 131*b* and 132*b* are disposed on the third electrode layers 131*c* and 132*c* and the first electrode layers 131*a* and 132*a*. For example, the first external electrode 131 may include a 3-1-th electrode layer 131*c*, a 1-1-th electrode layer 131*a*, and a 2-1-th electrode layer 131*b* as a plurality of electrode layers. The second external electrode 132 may include a 3-2-th electrode layer 132*c*, a 1-2-th electrode layer 132*a*, and a 2-2-th electrode layer 132*b* as a plurality of electrode layers. The 3-1-th electrode layer 131*c* may be connected to the plurality of first internal electrodes 121. The 3-2-th electrode layer 132*c* may be connected to the plurality of second internal electrodes 122. The third electrode layers 131*c* and 132*c* may be thicker than the first electrode layers 131*a* and 132*a*, and the first electrode layers 131*a* and 132*a* may be thicker than the second electrode layers 131*b* and 132*b*, but exemplary embodiments are not limited thereto.

The 3-1-th electrode layer 131*c* may be disposed on the first surface of the body 110 to extend partially upwardly of third to fifth surfaces of the body 110 or to extend partially upwardly of only a fifth surface of the body 110, the 1-1-th electrode layer 131*a* may be disposed on a sixth surface of the body 110 to extend partially upwardly of the 3-1-th electrode layer 131*c*, and the 2-1-th electrode layer 131*b* may be disposed on the 3-1-th electrode layer 131*c* and the 1-1-th electrode layer 131*a* to cover the 3-1-th electrode layer 131*c* and the 1-1-th electrode layer 131*a*, but exemplary embodiments are not limited thereto.

The 3-2-th electrode layer 132c may be disposed on a second surface of the body 110 to extend partially upwardly of third to fifth surfaces of the body 110 or to partially upwardly of only a fifth surface of the body 110, the 1-2-th electrode layer 132a may be disposed on a sixth surface of the body 110 to extend partially upwardly of the 3-2-th electrode layer 132c, and the 2-2-th electrode layer 132b may be disposed on the 3-2-th electrode layer 132c and the 1-2-th electrode layer 132a to cover the 3-2-th electrode layer 132c and the 1-2-th electrode layer 132a, but exemplary embodiments are not limited thereto.

Each of the first electrode layers 131a and 132a and the third electrode layers 131c and 132c may be directly disposed on at least one surface of the body 110. For example, the 3-1-th electrode layer 131c may be directly disposed on the first surface of the body 110, and a portion of the 3-1-th electrode layer 131c may be disposed to directly extend to the third to fifth surfaces of the body 110 or to directly extend to only the fifth surface of the body 110. The 1-1-th electrode layer 131a may be directly disposed on the sixth surface of the body 110, and at least a portion of The 1-1-th electrode layer 131a may be disposed to extend upwardly of the third-first electrode layer 131c to be in direct contact with at least a portion of the 3-1-th electrode layer 131c. The 2-1-th electrode layer 131b may be directly disposed on the 3-1-th electrode layer 131c and the 1-1-th electrode layer 131a. In addition, the 3-2-th electrode layer 132c may be directly disposed on the second surface of the body 110, and a portion of the 3-2-th electrode layer 132c may be disposed to directly extend to the third to fifth surfaces of the body 110 or to directly extend to only the fifth electrode layer 132c A portion may be disposed to extend directly to only the fifth surface of the body 110. The 1-2-th electrode layer 132a may be directly disposed on the sixth surface of the body 110, and at least a portion of the 1-2-th electrode layer 132a may be disposed to extend upwardly of the 3-2-th electrode layer 132c to be in direct contact with at least portion of the 3-2-th electrode layer 132c. The 2-2-th electrode layer 132b may be directly disposed on the 3-2 electrode layer 132c and the 1-2 electrode layer 132a.

The third electrode layers 131c and 132c may be formed by dipping opposite end portions of the body 110 into a paste including a conductive material in a state in which the sixth surface of the body 110 is blocked with a barrier. Alternatively, the third electrode layers 131c and 132c may be formed by dipping opposite end portions of the body 110 in a paste including a conductive material and then removing a portion formed on the sixth surface of the body 110. However, exemplary embodiments are not limited thereto, and the third electrode layers 131c and 132c may be formed by directly printing a conductive paste including a conductor on surfaces of opposite end portions of the body 110, except for the sixth surface, using screen-printing, or the like. Alternatively, the third electrode layers 131c and 132c may be formed by attaching a conductor sheet or a conductor pad, for example, a copper sheet or a nickel sheet, to the first and second surfaces of the body 110, respectively corresponding to head surfaces, drying the attached conductor sheet or the conductive pad, and directly printing a conductive paste including a conductor on the fifth surface of opposite end portions of the body 100, corresponding to a top band, using screen-printing, or the like. Thus, the third electrode layers 131c and 132c having a substantially inverted L shape in a cross-section.

The first electrode layers 131a and 132a may be formed after the third electrode layers 131c and 132c are formed. For example, the first electrode layers 131a and 132a may be formed by forming the third electrode layers 131c and 132c and then directly printing a mixture material, including metal particles and an insulating resin, on the sixth surface of the body 110 corresponding to a bottom band using screen-printing. However, exemplary embodiments are not limited thereto, and the first electrode layers 131a and 132a may be formed by forming the third electrode layers 131c and 132c and then selectively dipping the sixth surface of the body 110, corresponding to the bottom band, into a mixture material including metal particles and an insulating resin. Thus, the first electrode layers 131a and 132a having a substantially "-" shape in a cross-section. In addition, at least a portion of the first electrode layers 131a and 132a may be disposed to extend upwardly of the third electrode layers 131c and 132c to be in direct contact therewith, respectively.

The second electrode layers 131b and 132b may be formed after the third electrode layers 131c and 132c and the first electrode layers 131a and 132a are formed. For example, the second electrode layers 131b and 132b may be formed by performing a plating process on the electrode layers 131a and 132a. As the plating process, an electrolytic plating process, an electroless plating process, or the like, may be used. Thus, the second electrode layers 131b and 132b may be directly disposed on the third electrode layers 131c and 132c and the first electrode layers 131a and 132a.

In this regard, in a cross-section, the third electrode layers 131c and 132c may be directly disposed on the side and upper surfaces of the body 110, and the first electrode layers 131a and 132a may be directly disposed on the lower surface of the body 110. The second electrode layers 131b and 132b may be disposed on the third electrode layers 131c and 132c and the first electrode layers 131a and 132a.

Here, "in a cross-section" may refer to a cross-sectional shape when an object is vertically taken in an X direction and a Z direction, or a cross-sectional shape when the object is viewed in a side view based on a Y direction.

As described above, when the third electrode layers 131c and 132c are formed by separately forming layers in a head region and a top band region of the body 110, the third electrode layers 131c and 132c may include a first region, directly disposed on the side surface of the body 110, and a second region, directly disposed on the upper surface of the body 110, in a cross-section. At least a portion of the second region may be disposed to extend upwardly of the first region to be in direct contact with at least a portion of the first region. The first region and the second region may be regions separated from each other and having a boundary surface with each other.

The other contents are substantially the same as described in the above-described composite electronic component 500A according to an exemplary embodiment, the above-described composite electronic component 500B according to another exemplary embodiment, and the above-described composite electronic component 500c according to another exemplary embodiment and redundant descriptions will be omitted.

Figure 6:
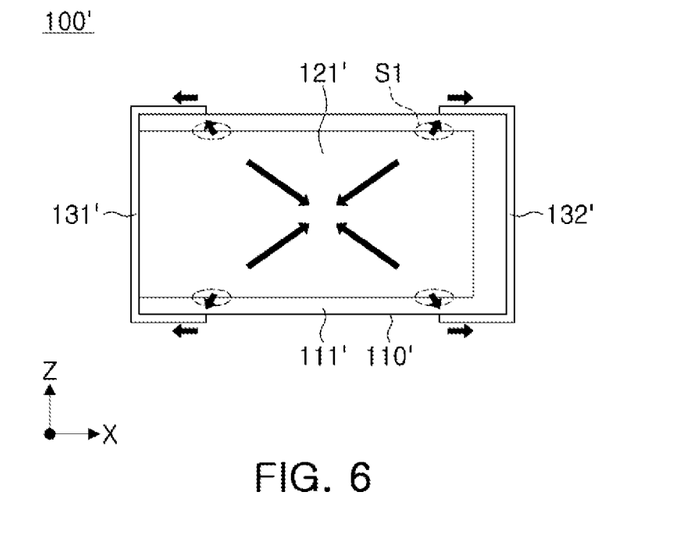
FIG. 6 is a schematic cross-sectional view illustrating a mechanism in which thermal stress is generated inside a single piece of ceramic electronic component during a reflow process.

FIG. 6 is a schematic cross-sectional view illustrating a mechanism in which thermal stress is generated inside a single piece of ceramic electronic component during a reflow process.

Referring to FIG. 6, a single piece of ceramic electronic component 100' may include a body 110', including a dielectric layer 111' and an internal electrode 121', and external electrodes 131' and 132' disposed on the body 110'. The body 110' may further include an internal electrode (not illustrated) connected to the external electrode 132', other than the internal electrode 121' illustrated in the drawing.

Continuing to refer to FIG. 6, in a structure of the single piece of ceramic electronic component 100', the internal electrode 121' having a higher coefficient of thermal expansion (CTE) than the dielectric layer 111' may exhibit a behavior of shrinkage toward a central portion. An internal electrode (not illustrated), connected to the external electrode 132', may also exhibit a similar behavior of shrinkage. In addition, the external electrodes 131' and 132' having a higher coefficient of thermal expansion (CTE) than a dielectric material may have a behavior of pulling the dielectric layer 111' from end portions of the external electrodes 131' and 132' while shrinking. Therefore, maximum tensile stress S1 may be generated in the end portions of the upper and lower external electrodes 131' and 132' due to the shrinkage behavior of the internal electrodes 121' and the dielectric pulling behavior resulting from the shrinkage of the external electrodes 131' and 132'.

Figure 7:
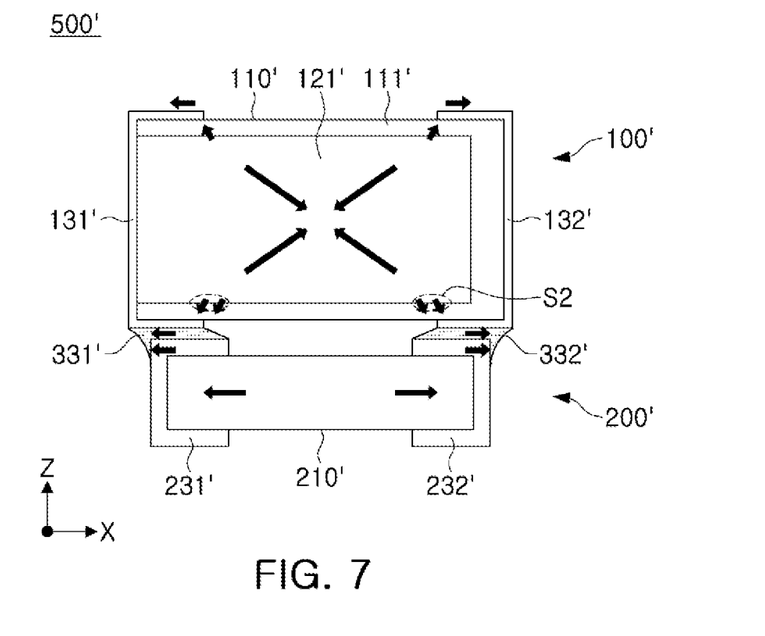
FIG. 7 is a schematic cross-sectional view illustrating a mechanism in which thermal stress is generated inside a composite electronic component.

FIG. 7 is a schematic cross-sectional view illustrating a mechanism in which thermal stress is generated inside a composite electronic component.

Referring to FIG. 7, a composite electronic component 500' may include a ceramic electronic component 100' and an interposer 200' coupled to the ceramic electronic component 100'. The composite electronic component 500' may include a body 110', including a dielectric layer 111' and an internal electrode 121, and external electrodes 131' and 132' disposed on the body 110'. The body 110' may further include an internal electrode (not illustrated), connected to the external electrode 132', other than the internal electrode 121' illustrated in the drawing. The interposer 200' may include a substrate 210' and connection electrodes 231' and 232' disposed on the substrate 210'. The external electrodes 131' and 132' and the connecting electrodes 231' and 232' are connected through solders 331' and 332'.

Continuing to refer to FIG. 7, in a structure of the composite electronic component 500', a coefficient of thermal expansion (CTE) of the substrate 210' is lower than that of the dielectric layer 111' during reflow temperature reduction, so that the amount of shrinkage of the substrate 210' is smaller than the amount of shrinkage of the dielectric layer 111'. Accordingly, the dielectric layer 111' may act as a behavior of relatively expanding the substrate 210'. When the substrate 210' expands relatively, a behavior of outwardly pushing the external electrodes 131' and 132' may occur. As a result, a behavior of dipping the dielectric layer 111' in lower end portions of the external electrodes 131' and 132' may be increased, and thus, maximum tensile stress S2 in the vicinity of the lower end portions may be further increased.

Figure 8:
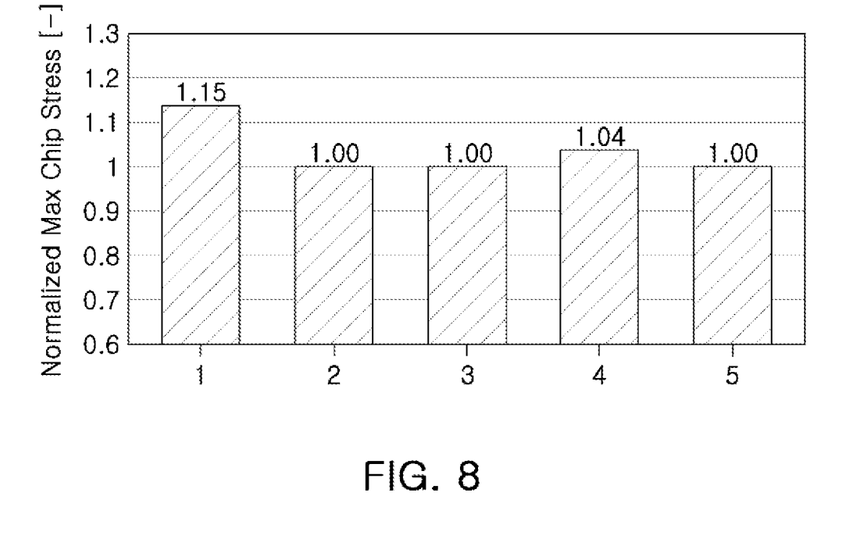
FIG. 8 is a simulation result illustrating maximum stress generated inside a chip during reflow of various types of composite electronic component, as compared with a single piece of ceramic electronic component.

FIG. 8 is a simulation result illustrating maximum stress generated inside a chip during reflow of various types of composite electronic component, as compared with a single piece of ceramic electronic component.

In FIG. 8, "Normalized Max Chip Stress" represents a relative stress level compared with the structure of the single piece of ceramic electronic component 100' illustrated in FIG. 6. For example, when the stress level is 1.15, it means that stress is 15% higher than that of the structure of the single piece of ceramic electronic component 100'. Experimental Example "1" is a simulation result in the structure of the composite electronic component 500' illustrated in FIG. 7. In this case, the external electrodes 131' and 132' have a form in which a third electrode layer, including copper (Cu), and a second electrode layer, including a nickel (Ni) layer and a tin (Sn) layer, are sequentially formed. For example, the external electrodes 131' and 132' may not include the first electrode layer, a relatively flexible layer, but may include only these relatively rigid layers. In addition, Experimental Examples "2," "3," "4," and "5" are simulation results in the structures of the composite electronic component 500A according to an exemplary embodiment, the composite electronic component 500B according to another exemplary embodiment, the composite electronic component 500C according to another exemplary embodiment, and the composite electronic component 500D according to another exemplary embodiment described in FIGS. 2, 3, 4, and 5, respectively.

Referring to FIG. 8, in the case of Experimental Example "1," the rigid external electrodes 131' and 132' have a relatively high modulus to obtain a thermal stress generation mechanism, so that internal stress is 15% higher than the structure of the single piece of ceramic electronic component 100'. On the other hand, in the cases of Experimental Examples "2," "3," "4," and "5," all of the external electrodes 131 and 132 include relatively flexible first electrode layers 131a and 132a. When the substrate 210 relatively expands compared with the dielectric layer 111, the relatively flexible first electrode layers 131a and 132a themselves are stretched, rather than the dielectric layer 111 being pulled, to eliminate a difference in coefficient of thermal expansion (CTE) between the ceramic electronic component 100 and the interposer 200. Therefore, it can be seen that in Experimental Examples "2," "3," and "5" in which the relatively flexible first electrode layers 131a and 132a are directly introduced on the body 110, maximum internal stress may be reduced to a level similar to that of the structure of the single piece of the ceramic electronic component 100'. In particular, it can be seen that in the case of Experimental Example "5," connectivity between the internal electrodes 121 and 122 and the external electrodes 131 and 132 may be secured and thermal stress caused by the difference in coefficient of thermal expansion (CTE) may be effectively reduced. In addition, it can be seen that in Experimental Example "4" in which relatively flexible first electrode layers 131a and 132a are introduced between the third electrode layers 131c and 132c and the second electrode layers 131b and 132b, about 70% of an increase in internal stress caused by the attachment of the interposer 200 may be eliminated.

As described above, a composite electronic component, which may reduce thermal stress generated inside a ceramic electronic component, may be provided.

In the present disclosure, the terms "lower side", "lower portion", "lower surface," and the like, have been used to indicate a direction toward a mounted surface of the electronic component package in relation to cross sections of the drawings, the terms "upper side", "upper portion", "upper surface," and the like, have been used to indicate an opposite direction to the direction indicated by the terms "lower side", "lower portion", "lower surface," and the like. However, these directions are defined for convenience of explanation only, and the claims are not particularly limited by the directions defined, as described above.

The meaning of a "connection" of a component to another component in the description includes an indirect connection through an adhesive layer as well as a direct connection between two components. In addition, "electrically connected" means including a physical connection and a physical disconnection. It can be understood that when an element is referred to as "first" and "second", the element is not limited thereby. These terms may be used only for a purpose of distinguishing the element from the other elements, and may not limit the sequence or importance of the elements. In some cases, a first element may be referred to as a second element without departing from the scope of the claims set forth herein. Similarly, a second element may also be referred to as a first element.

The term "an example embodiment" used herein does not always refer to the same example embodiment, and is provided to emphasize a particular feature or characteristic different from that of another example embodiment. However, example embodiments provided herein are considered to be able to be implemented by being combined in whole or in part one with another. For example, one element described in a particular example embodiment, even if it is not described in another example embodiment, may be understood as a description related to another example embodiment, unless an opposite or contradictory description is provided therein.

Terms used herein are used only in order to describe an example embodiment rather than to limit the present disclosure. In this case, singular forms include plural forms unless necessarily interpreted otherwise, based on a particular context.

While exemplary embodiments have been shown and described above, it will be apparent to those skilled in the art that modifications and variations could be made without departing from the scope of the present disclosure as defined by the appended claims.

What is claimed is:

1. A composite electronic component comprising:
   a ceramic electronic component including a body, comprising a dielectric layer and an internal electrode, and an external electrode disposed on the body and connected to the internal electrode through a surface of the body; and
   an interposer including a substrate, disposed below the body in a first direction, and a connection electrode disposed on the substrate and connected to the external electrode by a connection member, wherein:
   the external electrode includes a first electrode layer disposed directly on a lower surface of the body and including metal particles and an insulating resin, and a third electrode layer connected to the internal electrode, the third electrode layer disposed on a side surface and an upper surface of the body and including a conductive material and glass,
   a coefficient of thermal expansion of the substrate is lower than that of the dielectric layer, and
   the internal electrode includes a plurality of first and second internal electrodes alternately laminated in a second direction perpendicular to the first direction.

2. The composite electronic component of claim 1, wherein:
   the metal particles include at least one of copper (Cu) or silver (Ag); and
   the insulating resin includes epoxy.

3. The composite electronic component of claim 1, wherein:
   the first electrode layer has a modulus of 10 GPa or less.

4. The composite electronic component of claim 1, wherein the external electrode further comprises a second electrode layer disposed on the first electrode layer.

5. The composite electronic component of claim 4, wherein the third electrode layer is disposed between the body and the first electrode layer.

6. The composite electronic component of claim 5, wherein:
   the third electrode layer includes a conductive layer including copper (Cu); and
   the second electrode layer includes at least one of a metal layer, including nickel (Ni), or a metal layer including tin (Sn).

7. The composite electronic component of claim 1,
   wherein the external electrode further comprise a second electrode layer disposed on the third electrode layer and the first electrode layer; and
   in a cross-section,
   the third electrode layer is disposed directly on the side surface and the upper surface of the body; and
   at least a portion of the first electrode layer is disposed to extend upwardly of the third electrode layer to be in direct contact with at least a portion of the third electrode layer.

8. The composite electronic component of claim 7, wherein:
   in a cross-section, the third electrode layer includes a first region, disposed to be in direct contact with the side surface of the body, and a second region disposed directly on the upper surface of the body;
   at least a portion of the second region is disposed to extend upwardly of the first region to be in direct contact with at least a portion of the first region; and
   the first region and the second region have a boundary surface with each other.

9. The composite electronic component of claim 7, wherein:
   the third electrode layer includes a conductive layer including copper (Cu); and
   the second electrode layer includes at least one of a metal layer, including nickel (Ni), or a metal layer including tin (Sn).

10. The composite electronic component of claim 1, wherein:
    the external electrode includes a first external electrode and a second external electrode, respectively disposed in opposite end portions of the body in a length direction; and
    the plurality of first and second internal electrodes are respectively connected to the first and second external electrodes.

11. The composite electronic component of claim 1, wherein:
    a length of the body is larger than a length of the substrate;
    a thickness of the body is higher than a thickness of the substrate; and
    a width of the body is wider than a width of the substrate.

12. The composite electronic component of claim 1, wherein:
    the substrate includes alumina ($Al_2O_3$).

13. The composite electronic component of claim 1, wherein:
    the connection electrode comprises:
    a conductive resin layer disposed on the substrate; and
    a plating layer disposed on the conductive resin layer.

14. The composite electronic component of claim 1, wherein the connection member covers an edge of the connection electrode.

15. The composite electronic component of claim 1, wherein the connection member contacts: (i) a first surface of the connection electrode facing the ceramic electronic component and (ii) a second surface of the connection electrode adjacent to the first surface of the connection electrode.

16. A composite electronic component comprising:
    a ceramic electronic component including a body, comprising a dielectric layer and an internal electrode, and an external electrode disposed on the body and connected to the internal electrode through a surface of the body; and an interposer including a substrate, disposed below the body in a first direction, and a connection electrode disposed on the substrate and connected to the external electrode by a connection member, wherein:

the external electrode includes a first electrode layer, disposed directly on a lower surface of the body, a second electrode layer disposed on the first electrode layer, and a third electrode layer connected to the internal electrode, the third electrode layer disposed on a side surface and an upper surface of the body and including a conductive material and glass, the first electrode layer has a modulus lower than a modulus of the second electrode layer, a coefficient of thermal expansion of the substrate is lower than that of the dielectric layer, and the internal electrode includes a plurality of first and second internal electrodes alternately laminated in a second direction perpendicular to the first direction.

17. The composite electronic component of claim 16, wherein:

the first electrode layer includes metal particles, including at least one of copper (Cu) or silver (Ag), and an insulating resin including epoxy; and the second electrode layer includes at least one of nickel (Ni) or tin (Sn).

18. The composite electronic component of claim 16, wherein the connection member covers an edge of the connection electrode.

19. The composite electronic component of claim 16, wherein the connection member contacts: (i) a first surface of the connection electrode facing the ceramic electronic component and (ii) a second surface of the connection electrode adjacent to the first surface of the connection electrode.

* * * * *